United States Patent [19]

Fujioka

[11] Patent Number: 5,142,641
[45] Date of Patent: Aug. 25, 1992

[54] CMOS STRUCTURE FOR ELIMINATING LATCH-UP OF PARASITIC THYRISTOR

[75] Inventor: Hiroshi Fujioka, Tokyo, Japan

[73] Assignee: Fujitsu Limited, Kawasaki, Japan

[21] Appl. No.: 657,380

[22] Filed: Feb. 19, 1991

Related U.S. Application Data

[63] Continuation of Ser. No. 327,729, Mar. 23, 1989, abandoned.

[30] Foreign Application Priority Data

Mar. 23, 1988 [JP] Japan .................. 63-68756

[51] Int. Cl.⁵ ........................... H01L 27/02
[52] U.S. Cl. ........................... 357/42; 357/16; 357/23.1; 357/63
[58] Field of Search ............ 357/16, 42, 63, 23.1

[56] References Cited

U.S. PATENT DOCUMENTS

| | | | |
|---|---|---|---|
| 3,242,018 | 3/1966 | Grabmaier et al. | 357/16 |
| 4,035,665 | 7/1977 | Borel et al. | 357/16 |
| 4,521,794 | 6/1985 | Murase et al. | 357/63 |
| 4,635,089 | 1/1987 | Shimbo | 357/42 |
| 4,683,645 | 8/1987 | Naguib et al. | 357/63 |
| 4,710,478 | 12/1987 | Yoder et al. | 357/16 |
| 4,728,998 | 3/1988 | Strain | 357/42 |
| 4,769,689 | 9/1988 | Lin | 357/63 |
| 4,803,173 | 2/1989 | Sill et al. | 357/23.1 |
| 4,885,617 | 12/1989 | Mazure-Espejo et al. | 357/42 |
| 4,922,311 | 5/1990 | Lee et al. | 357/23.1 |
| 4,969,031 | 11/1990 | Kobayashi et al. | 357/63 |

FOREIGN PATENT DOCUMENTS 55-117233  9/1980  Japan .................. 357/63

OTHER PUBLICATIONS

Semiconductor devices-Physics and Technology, Appendix F, "Properties of Important Semiconductors at 300K" by S. M. Sze, Jan. 1985, p. 513.

*Primary Examiner*—Rolf Hille
*Assistant Examiner*—Steven Loke
*Attorney, Agent, or Firm*—Staas & Halsey

[57] ABSTRACT

A complementary metal oxide semiconductor device comprises a substrate made of a first semiconductor material doped to a first conductivity type, a first field effect transistor including a first channel region defined in the substrate, a first source region provided on the substrate, a first drain region provided on the substrate and a gate electrode provided on the the substrate above the first channel region, a well defined in the substrate in an area excluding the first field effect transistor, a second field effect transistor including a second channel region defined in the well, a second source region provided on the well, a second drain region provided on the well, and a second gate electrode provided on the the well above the second channel region, wherein at least one of the first and second source regions is made of a semiconductor material having a band gap substantially narrower than the band gap of the first semiconductor material.

9 Claims, 6 Drawing Sheets

FIG.1
(PRIOR ART)

(PRIOR ART)

CMOS STRUCTURE FOR ELIMINATING LATCH-UP OF PARASITIC THYRISTOR

This application is a continuation of application Ser. No. 07/327,729, filed Mar. 23, 1989, now abandoned.

BACKGROUND OF THE INVENTION

The present invention generally relates to so called complementary metal oxide semiconductor (CMOS) devices, and more particularly to a CMOS structure wherein a latch-up by a parasitic thyristor associated with such a structure is eliminated.

A CMOS device is a semiconductor device in which a p-channel MOS transistor and an n-channel MOS transistor are formed on a common substrate. Such a device has an advantage of low power consumption and is used widely in various integrated circuits, particularly in a large scale integrated circuit (LSI) in which a large number of semiconductor devices are assembled in a unit area of a semiconductor substrate.

In a typical CMOS device, one of the p-channel and n-channel MOS transistors is formed directly on a substrate doped to one conductive type while the other of the MOS transistors is formed in a well defined in the substrate and doped to the other conductive type.

In a typical example, a silicon substrate doped to the n-type is used and the p-channel MOS transistor is formed directly in the substrate. Further, a well doped to the p-type is defined in the substrate and the p-channel MOS transistor is formed in the well thus defined. In operation, the substrate and the well are applied with a bias voltage such that a pn-junction formed at a boundary between the substrate and the well is reversely biased. In such a structure, it is well known that a parasitic thyristor is formed between an n$^+$-type region formed in the p-type well as the source of the MOS transistor and a p$^+$-type region formed in the n-type substrate as the source of the MOS transistor. Such a parasitic thyristor tends to be turned ON responsive to a noise signal and the like particularly in a device where a large number of p-channel and n-channel MOS transistors are formed in a unit area of the substrate with a relatively short mutual separation as in the case of the LSI device. Such a phenomenon is known as "latch-up". Once the latch-up occurs, a short circuit path is formed across the p-channel and n-channel MOS transistors and the CMOS device no longer operates properly or may be damaged. This short circuit path cannot be eliminated unless the power of the CMOS device is substantially shut-off.

In order to avoid the problem of latch-up, conventional CMOS devices use a structure in which the p-channel MOS transistor and the n-channel MOS transistor are separated by a sufficient distance or a structure in which the well extends deeply into the substrate. However, such an approach increases the size of the CMOS device and is contradictory to the requirement of size reduction of the CMOS device.

Further, there is proposed the use of a heavily doped substrate on which a less doped region is grown epitaxially so that the p-channel or n-channel MOS transistors are formed in this less doped region, of an isolation trench structure for separating the p-channel and n-channel MOS transistors. Further, there is proposed an isolation structure made from a heavily doped region provided along a boundary between the well and the substrate so as to increase the junction capacitance in such a boundary area, as is disclosed in the Japanese Laid-open Patent Application No.63-244671. However, these approaches require modification of a simple basic structure of the CMOS device and cause another problem in that the process of manufacturing becomes complicated. Further, the size of the such CMOS devices cannot be reduced beyond a certain limit because of the existence of such isolation structures. Therefore, such an approach contradicts the requirement of increasing the integration density of the LSI device.

SUMMARY OF THE INVENTION

Accordingly, it is a general object of the present invention to provide a novel and useful structure of a CMOS device wherein the problems aforementioned are eliminated.

Another and more specific object of the present invention is to provide a structure of a CMOS device in which the problem of latch-up is substantially eliminated without sacrificing the integration density of an integrated circuit device comprising a number of such CMOS devices.

Another object of the present invention is to provide a structure of a CMOS device wherein a source region of a MOS transistor constituting a terminal region of a parasitic thyristor associated with the CMOS device is made from a first semiconductor material doped to a first conductive type and having a band gap which is substantially smaller than the band gap of a second semiconductor material doped to another conductive type and constituting a channel region of said MOS transistor. According to the present invention, the injection coefficient at an emitter of a parasitic bipolar transistor constituting the parasitic thyristor is decreased as a result of the use of the first semiconductor material having the small band gap for the source region. Responsive to the decrease in the injection coefficient, the common emitter current gain of such a bipolar transistor is reduced and the latch-up of the parasitic thyristor is substantially eliminated without modifying the basic structure of the complementary metal oxide semiconductor device. As a result, an isolation structure hitherto used for separating a p-channel MOS transistor and a n-channel MOS transistor in the conventional CMOS device can be omitted and the size of the CMOS device can be reduced significantly without increasing the risk of the latch-up of the parasitic thyristor. Thus the structure of the present invention is particularly well-suited for a large scale integrated circuit having a high integration density.

Other objects and further features of the present invention will become apparent from the following detailed description for preferred embodiments when read in conjunction with attached drawings.

DETAILED DESCRIPTION

First, a parasitic thyristor formed in association with a conventional CMOS structure will be described with reference to FIG. 1.

Figure 1:
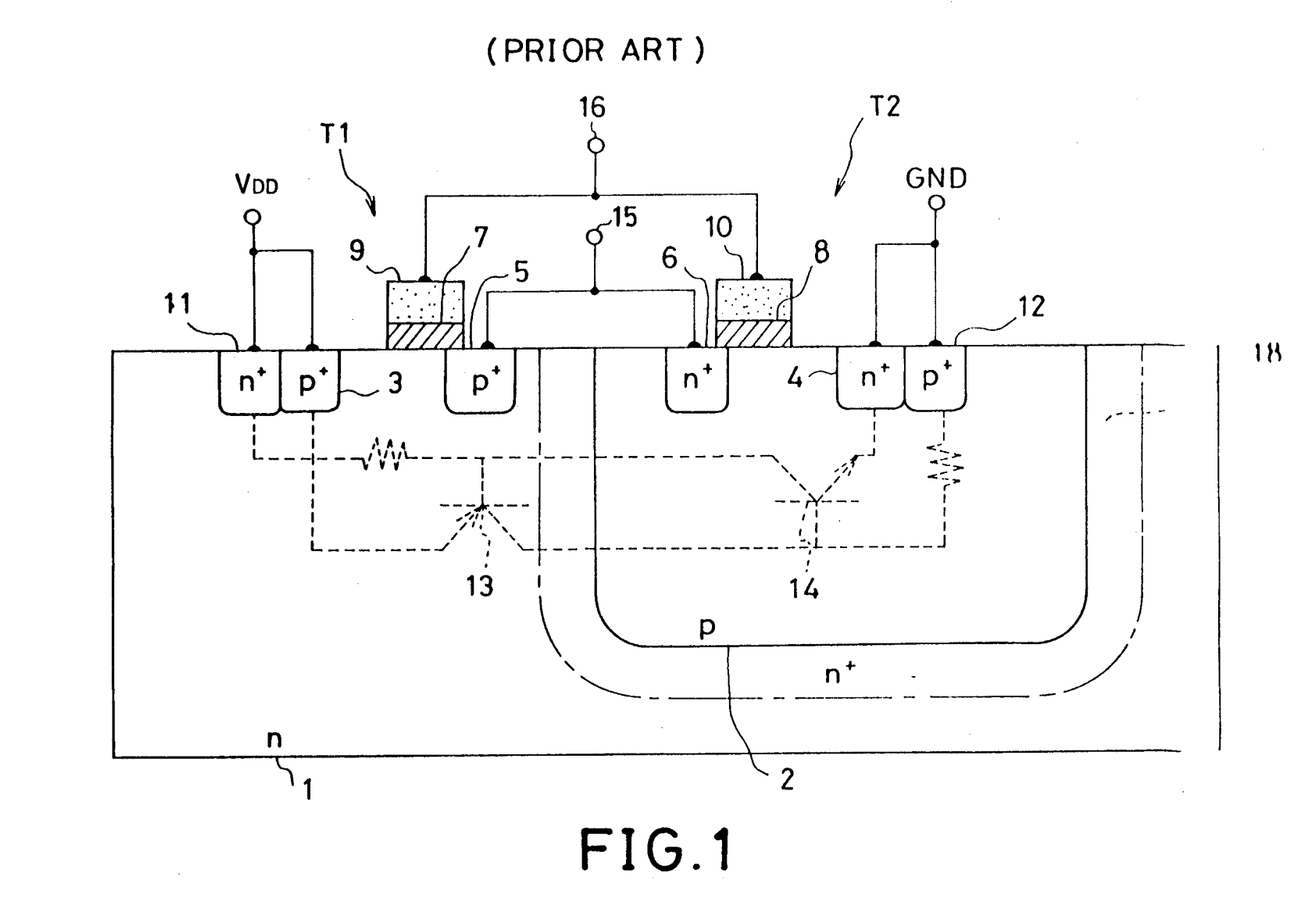
FIG. 1 is a cross sectional view showing a prior art CMOS device for explanation of a parasitic thyristor associated with such a device.

Referring to FIG. 1, a silicon substrate 1 is doped to the n-type. Further, a well 2 doped to the p-type is formed in the substrate 1. In a part of the substrate 1 excluding the well 2, a source region 3 and a drain region 5 of a p-channel MOS transistor T1, both doped to the p$^-$ type, are formed. Further, a gate insulator 7 is formed on the top of the substrate 1 in an area between the source region 3 and the drain region 5. On the gate insulator 7, a polysilicon electrode 9 is deposited. In the well 2 doped to the p-type, a source region 4 and a drain region 6 of an n-channel MOS transistor T2, both doped to the n$^-$ type, are formed as illustrated. In an area in the well 2 between the source region 4 and the drain region 6, a gate insulator 8 is deposited and a gate electrode 10 made of polysilicon is further deposited on the gate insulator 8. Further, there are provided a terminal region 11 doped to the p$^-$ type in the area of the substrate 1 excluding the well 2 and another terminal region 12 doped to the n$^-$ type in the well 2 for applying a substrate bias voltage across a pn-junction at a boundary between the substrate 1 and the well 2. The terminals 11 and 12 are connected to a positive source voltage terminal V$_{DD}$ (5 volts) and GND (0 volt) respectively. In the illustrated example, the CMOS device forms an inverter in which the drain region 5 of the p-channel MOS transistor T1 and the drain region 6 of the n-channel MOS transistor T2 are connected in common at a terminal 15. Further, the gate electrode 7 of the MOS transistor T1 and the gate electrode 8 of the MOS transistor T2 are connected in common at a terminal 16.

In such a structure, a parasitic pnp-bipolar transistor 13 and a parasitic npn-bipolar transistor 14 are formed as illustrated by a broken line in FIG. 1. In the pnp-bipolar transistor 13, the emitter is provided by the p$^-$-type source region 3, the base is provided by the n-type substrate 1, and the collector is provided by the p-type well 2. Further, the emitter of the npn-bipolar transistor 14 is provided by the n$^-$-type source region 4, the base of the transistor 14 is provided by the p-type well 2, and the collector of the transistor 14 is provided by the substrate 1.

Figure 2:
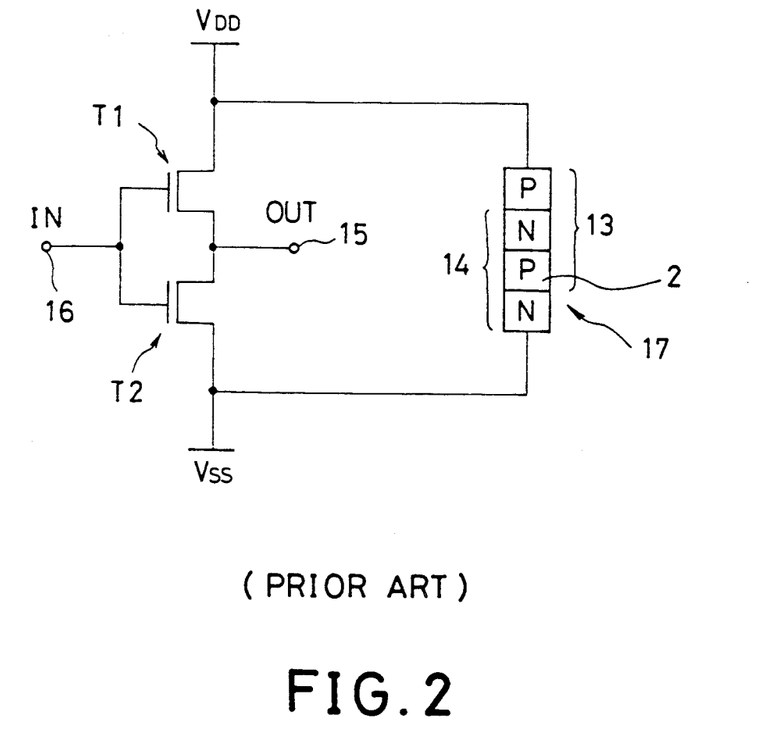
FIG. 2 is circuit diagram showing an equivalent circuit diagram of the device of FIG. 1.

FIG. 2 shows an equivalent circuit diagram of the device of FIG. 1. As can be seen in the drawing, a parasitic thyristor 17 comprising a pnp-junction part corresponding to the parasitic bipolar transistor 13 and an npn-junction part corresponding to the parasitic bipolar transistor 14 is formed across the source region 3 of the p-channel MOS transistor T1 and the source region 4 of the n-channel MOS transistor T2. Further, it can be seen that the channel region in the well 2 which forms the base of the parasitic bipolar transistor 14 also acts as the gate of the thyristor 17. In other words, when a positive voltage of sufficient amplitude is applied to the channel region 2 through the drain region 6, the parasitic thyristor 17 is triggered and is turned ON. Once the thyristor 17 is turned ON, it is easily understood that the CMOS device is shorted and a large short-circuit current flows from the source voltage terminal V$_{DD}$ to the ground terminal GND through the source region 3, the substrate 1, the well 2 and the source region 4.

Such a turn ON of the parasitic thyristor is caused for example when a noise is applied to the drain region 6 of the MOS transistor T2 through the output terminal 15. Conventionally such a triggering of the thyristor occurs when the voltage of such a noise exceeds 2-3 volts. Thus, there is a substantial risk that the device is destroyed by an electrical noise transmitted through the output terminal. This short-circuit current cannot be interrupted unless the power to the CMOS device is shut off.

It is well known that the condition of triggering of the parasitic thyristor 17 is represented by $\alpha_1 + \alpha_2 \geq 1$ where $\alpha_1$ and $\alpha_2$ are the common-base current gains for the bipolar transistors 13 and 14 respectively. Conventionally, the common-base current gain of the bipolar transistors 13 and 14 is suppressed by increasing the depth of the well 2 or by increasing the separation between the source region 3 and the well 2 so that sizes of the the base region of the transistors 13 and 14 are increased. According to such a construction, the recombination of the hole and the electron in the base regions is facilitated as a result of the increased distance of the paths of the electrons and holes moving across the base region. Further, the resistance in the emitter-collector path of the parasitic transistors 13 and 14 is increased. As a result, the common base current gains $\alpha_1$ and $\alpha_2$ are reduced. However, such an increase in the depth of the well 2 or the increase in the separation between the region 3 and the well 2 inevitably invites the increase in the size of the CMOS device and therefore contradicts with the requirement of increasing the integration density of the integrated circuit by using such devices.

As other means to avoid the latch-up of the parasitic thyristor 17, there is proposed a use of a highly doped region 18 as illustrated in FIG. 1 by a one-dotted line along a boundary between the well 2 and the substrate 1 as is disclosed in the aforementioned Japanese Laid-open Patent Application. The region may be doped to the n$^+$-type, for example and increases the junction capacitance between the substrate 1 and the well 2. However, such a structure needs a substantial thickness for the region 18 and therefore the reduction in size of the CMOS device is limited. Similarly, the conventional practice to provide an isolation trench on the surface of the substrate 1 at the boundary between the substrate 1 and the well 2 also limits the reduction of the size of the CMOS device because of the finite size of the isolation trench. Further, such an isolation trench can only reduce the common base current gain of the parasitic bipolar transistor 13 alone and does not affect to the common-base current gain of the transistor 14.

Further, it is known to use a so-called "n-on-n$^+$" or "p-on-p$^+$" type substrate in which a n-type or p-type layer is grown epitaxially on a n$^+$- or p$^+$-type substrate 1. However, such a method not only complicates the manufacturing process but can only reduce the common-base current gain of the parasitic bipolar transistor 14 and cannot reduce the common-base current gain of the bipolar transistor 13. Therefore, it is necessary to use such a structure in combination with other separating structures. In doing so, there again occurs the problem of limitation in the reduction of the size of the CMOS device.

Next, the CMOS structure of the present invention will now be described with reference to FIG. 3.

Figure 3:
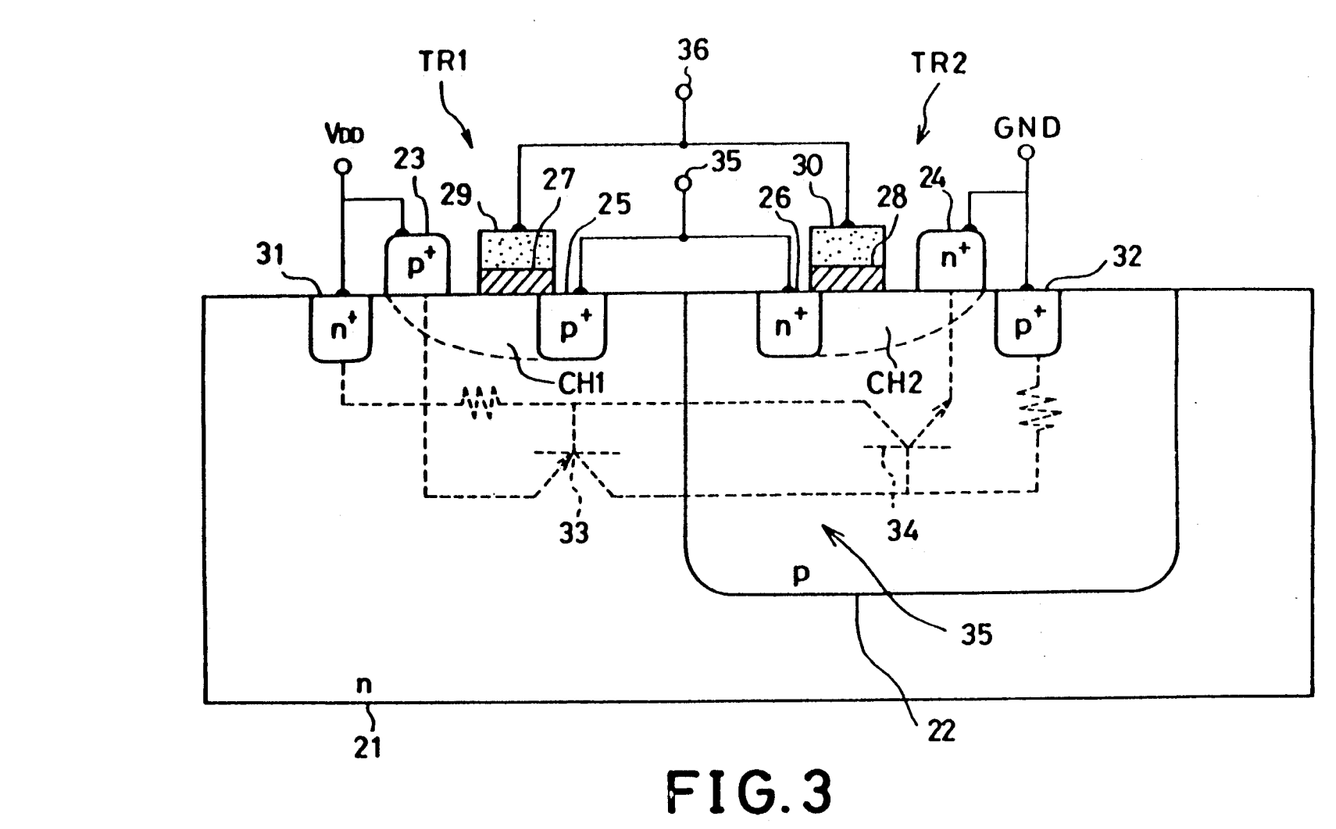
FIG. 3 is a cross sectional view showing the structure of the CMOS device of the present invention.

Referring to FIG. 3, the CMOS structure of the present invention comprises a silicon substrate 21 doped to the n-type, and a p-type well 22 is defined in a part of the silicon substrate 21 similarly to the conventional CMOS device structure. Further, a p⁻-type drain region 25 and a n⁻-type drain region 26 are formed respectively in the n-type substrate 1 and the p-type well 22. On the top of the substrate 21 excluding the region of the well 22, a gate insulator 27 is deposited and a polysilicon gate electrode 29 is further deposited on the gate insulator 27. Similarly, a gate insulator 28 is deposited on the top of the well 22 and a polysilicon gate electrode 30 is further deposited on the gate insulator 28. Furthermore, an n⁻-type terminal region 31 and a p⁺-type terminal region 32 for application of the substrate bias voltage are formed respectively in the substrate 21 and in the well 22.

In this structure, a p⁻-type source region 23 of a p-channel MOS transistor TR1 is formed on the top surface of the n-type silicon substrate 21 by a material which is different from the material of the substrate 21, by using a suitable method such as chemical vapor deposition (CVD). More specifically, the source region 23 is made from a material having a substantially narrower band gap as compared to silicon. Such a material may be a solid solution or alloy of silicon and germanium in which a substantial amount of silicon is replaced by germanium. In the illustrated example, about 15% of the silicon atom is substituted by the germanium atom and such a material has a band gap of about 0.92 eV at 300K which is substantially smaller than the band gap of silicon (1.12 eV at 300° K.). Similarly, an n⁻-type source region 24 of a n-channel MOS transistor TR2 is formed on the top of the p-type well 22 by a material different from the material of the well 22. The material used for the source region 24 may be the same silicon germanium alloy for source region 23, as described except for its conductivity type which instead is doped to the n⁻-type.

The provision of the source regions 23 and 24 may be made by various methods. When depositing them by the CVD technique, a mixture of silane (SiH₄) and germane (GeH₄) is used as a source gas together with an impurity gas such as phosphine (PH₃) or diborane (B₂H₆). The material is deposited on the substrate 21 or on the well 22 up to a thickness of about 1000Å at a temperature of about 580° C. under a pressure of about 1 Torr. The material thus deposited on the silicon substrate 21 or on the silicon well 22, though having a slightly different lattice constant from that of silicon, makes a excellent contact with the substrate or the well located underneath by adapting its lattice constant.

The CMOS device of the illustrated example is used as an inverter in which the drain region 25 of the p-channel MOS transistor TR1 and the drain region 26 of the n-channel MOS transistor TR2 are connected in common at a terminal 35 and the gate electrode 29 of the transistor TR1 and the gate electrode 30 of the transistor TR2 are connected in common at a terminal 36. The terminal 36 constitutes the input terminal of the inverter and the terminal 35 constitutes the output terminal of the inverter. The source voltage $V_{DD}$, relative to ground GND, is supplied across the source region 23 and the source region 24. The operation of the CMOS device shown in FIG. 3 itself is the same as the usual CMOS device. In other words, a hole emitted from the source region 23 is passed through a channel region CH1 and is recovered at the drain region 25. This flow of the hole through the channel region 25 is controlled by the electrical field created by the gate or control, voltage applied to the gate electrode 29 through the input terminal 36. Similarly, an electron emitted from the source region 24 is passed through a channel region CH2 and is recovered at the drain region 26. The flow of the electron through the channel region CH2 is controlled by the electrical field created by the gate, or control, voltage applied to the gate electrode 30 through the input terminal 36.

Even in such a structure, there is formed a parasitic bipolar transistor 33 and another parasitic bipolar transistor 34 constituting a parasitic thyristor 35 similarly to the conventional structure. However, it has been found that the retention voltage of the parasitic thyristor which is a voltage necessary to maintain the thyristor 35 in a turned ON state is increased to about 12–13 volts from the conventional retention voltage which is in the order of 2–3 volts. In other words, the CMOS device having the structure shown in FIG. 3 is turned OFF when the voltage applied across the thyristor 35 is decreased below 12–13 volts. Since the chance that such a large voltage, and exceeding 12–13 volts, is applied across the parasitic thyristor is virtually negligible, the risk that the parasitic thyristor 35 maintains its turned ON state after being triggered is virtually eliminated. It should be noted that the structure of the present invention does not use a particular separation or isolation structure which increases the size of the CMOS device. Therefore, the structure of the present invention can be made compact and is particularly suited for the CMOS device constituting the LSI or VLSI device in which a very large number of CMOS devices are assemble on a common substrate.

Next, the principle of the elimination of the triggering of the parasitic thyristor in the CMOS structure of the present invention will be described in brief.

Figure 4:
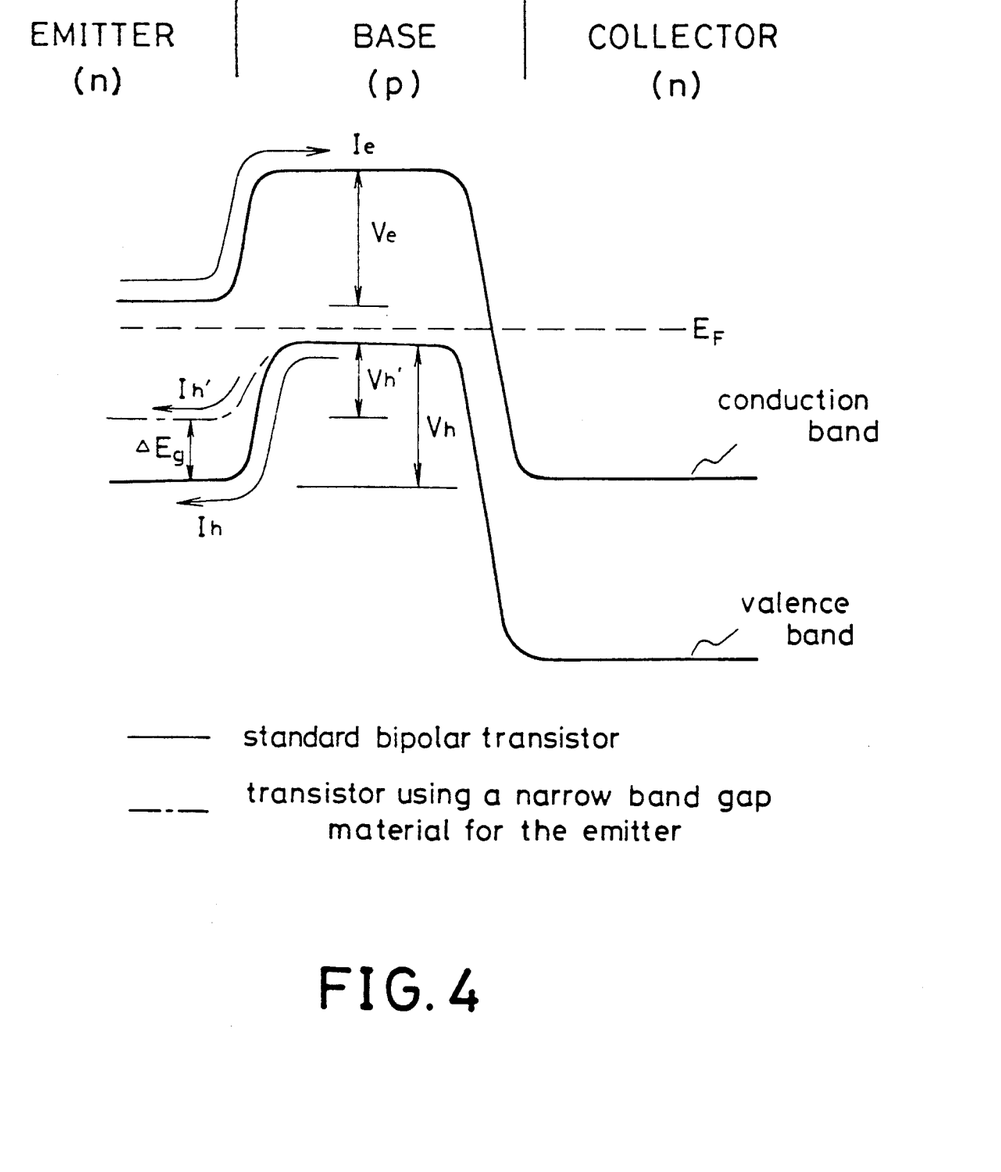
FIG. 4 is a diagram showing a band structure of a parasitic bipolar transistor associated with the parasitic thyristor for explanation of the principle of the present invention.

FIG. 4 shows a schematical band structure of an npn-bipolar transistor using a material having a narrow band gap for the emitter of the transistor in comparison with that of a standard npn-bipolar transistor where the band gap is the same in the emitter region, base region and the collector region. In the drawing, the band structure for the standard bipolar transistor is represented by a continuous line, and the band structure for the bipolar transistor having the narrow band gap in the emitter is represented by a one-dotted line. $E_F$ is the Fermi level.

In the standard bipolar transistor, the flow of electrons from the n-type emitter to the n-type collector across the p-type base is represented by $I_e$. Similarly, the flow of hole from the p-type base to the n-type emitter is represented by $I_h$. Further, $V_e$ represents a potential barrier at the base-emitter junction for the electrons flowing from the emitter to the collector across the base and $V_h$ represents a potential barrier for the holes flowing from the base to the emitter. Using these parameters, the injection efficiency $\alpha_E$ is represented as $$\alpha_E = I_e/(I_e + I_h) \tag{1}$$

for the standard bipolar transistor.

Further, the common emitter current gain $\beta$ is approximately represented for the standard bipolar transistor as $$\beta = I_C/I_B = I_e/I_h \tag{2}$$

where $I_C$ and $I_B$ respectively represent the collector current and the base current of the transistor. Using the common emitter current gain $\beta$, the common base current gain $\alpha$ which is critical to the triggering of the thyristor is represented as $$\alpha = \beta/(1 - \beta) \qquad (3)$$

It should be noted that, in the standard bipolar transistor, the potential barrier $V_e$ for the electron flow $I_e$ is substantially the same as the potential barrier $V_h$ for the hole flow $I_h$. Thus, the proportion of the electrons and the holes having an energy sufficient to flow over the potential barrier as a result of thermal agitation is proportional to a factor of $\exp(-V_e/kT)$ and $\exp(-V_h/kT)$.

When the material having the narrow band gap is used for the emitter as in the structure of the present invention, the valence band is modified as shown by a one-dotted line. In this drawing, the discontinuity arising in the actual band structure of such a heterojunction is omitted for simplicity of the drawing.

Assuming that the band structure of the valence band in the emitter is raised by $\Delta E_g$ as represented by the one-dotted line while the band structure of the conduction band is not changed, the potential barrier viewed from the standpoint of the holes is decreased from $V_h$ to $V_h'$, where $V_h' = V_h - \Delta E_g$ and the hole flow is increased by a factor of $\exp(\Delta E_g/kT)$, as shown by $$I_h' = I_h \cdot \exp(\Delta E_g / kT) \qquad (4)$$

where $I_h'$ represents the flow of the holes from the base to the emitter having the band structure thus modified.

Correspondingly, the injection coefficient $\alpha_E$ is modified to $\alpha_E'$ as $$\alpha_E' = I_e/(I_e + I_h \cdot \exp(\Delta E_g / kT)) \qquad (5)$$

and the common emitter current gain $\beta'$ and the common base current gain $\alpha'$ are respectively represented as $$\beta' = I_e/I_h \cdot \exp(-\Delta E_g/kT) \qquad (6)$$

and $$\alpha' = \beta'/(1 - \beta'). \qquad (7)$$

In the case of the CMOS structure of FIG. 3 in which the silicon germanium alloy containing about 15% germanium is used for the emitter of the parasitic bipolar transistor, the term $\Delta E_g$ takes a value of about 200 meV. As the term kT is about 26 meV at room temperature, the exponential term $\exp(\Delta E_g/kT)$ takes a value of about 8. In other words, the hole flow increases by about eight times and the injection coefficient $\alpha_E'$ is decreased correspondingly. Further, the common emitter current gain $\beta'$ is decreased to one-eighth as compared to the common emitter current gain $\beta$ of the standard bipolar transistor. Responsive to the decrease in the common emitter current gain $\beta'$, the common base current gain $\alpha'$ is decreased for both of the parasitic bipolar transistors 33 and 34 constituting the parasitic thyristor 35.

Similarly, the use of the material having the modified band structure for the conduction band provides a reduced injection coefficient and correspondingly reduced common base and common emitter current gains. The band structure of this material is almost the same as to that illustrated in FIG. 4 by the one-dotted line. As a result, the CMOS structure of the present invention successfully eliminates the latch-up of the parasitic thyristor associated with the CMOS structure as a result of the use of the narrow band gap material for the source region of the p-channel and n-channel MOS transistors constituting the CMOS device. It should be noted that no particular isolation structure, such as an isolation trench and the like is used in the present structure. Further, there is no limitation in the reduction of the distance between the well 22 and the source region 23 or in the reduction of the depth of the well 22. Thus, the structure of the present invention is quite well suited for the CMOS device used in LSI or VLSI devices.

In Eqs. (4)-(6), it is clear that the effect of the exponential term $\exp(\Delta E_g/kT)$ increases with decreasing temperature. In other words, the present structure for eliminating the latch-up works effectively, particularly in a low temperature region. Thus, even if the material used for the source regions 23 and 24 has a band gap which is not significantly smaller than the band gap of the substrate material, the effect of the reduction in the injection coefficient and the reduction of the common emitter and common base current gains can be enhanced by decreasing the operating temperature.

Figure 5:
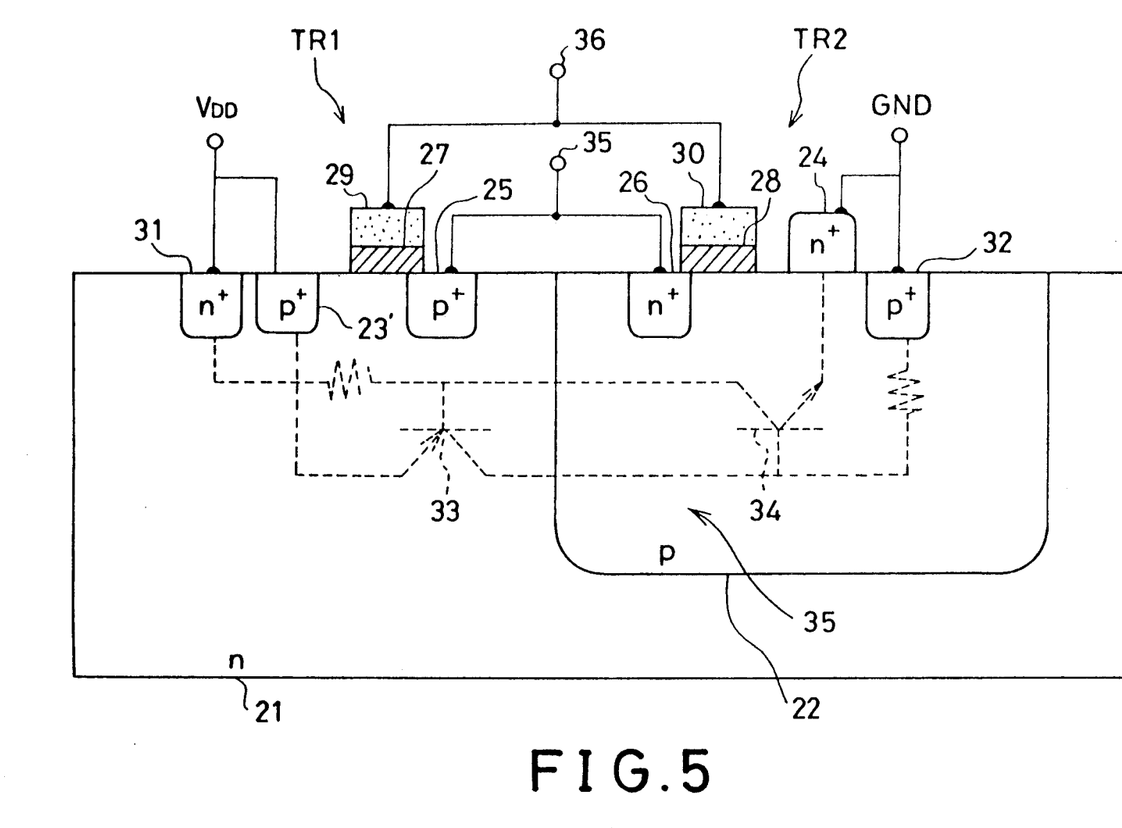
FIG. 5 is a cross sectional view showing a modification of the structure of FIG. 3.

FIG. 5 shows a modification of the structure of FIG. 3. In the drawing, these parts constructed identically to those corresponding parts in FIG. 3 are given identical reference numerals and the description thereof will be omitted.

In this modification, the source region made from the material having the narrow band gap is used only for the source region 24 of the n-channel MOS transistor TR2 and a source region 23' of the p-channel MOS transistor TR1 is formed in the substrate 21. In other words, the source region 23' is made from silicon similarly to the substrate 21. In this structure, the procedure to provide the p⁻-type region separately from the n⁺-type region 24 on the substrate 21 can be omitted and the manufacturing of the device becomes easier.

Figure 6:
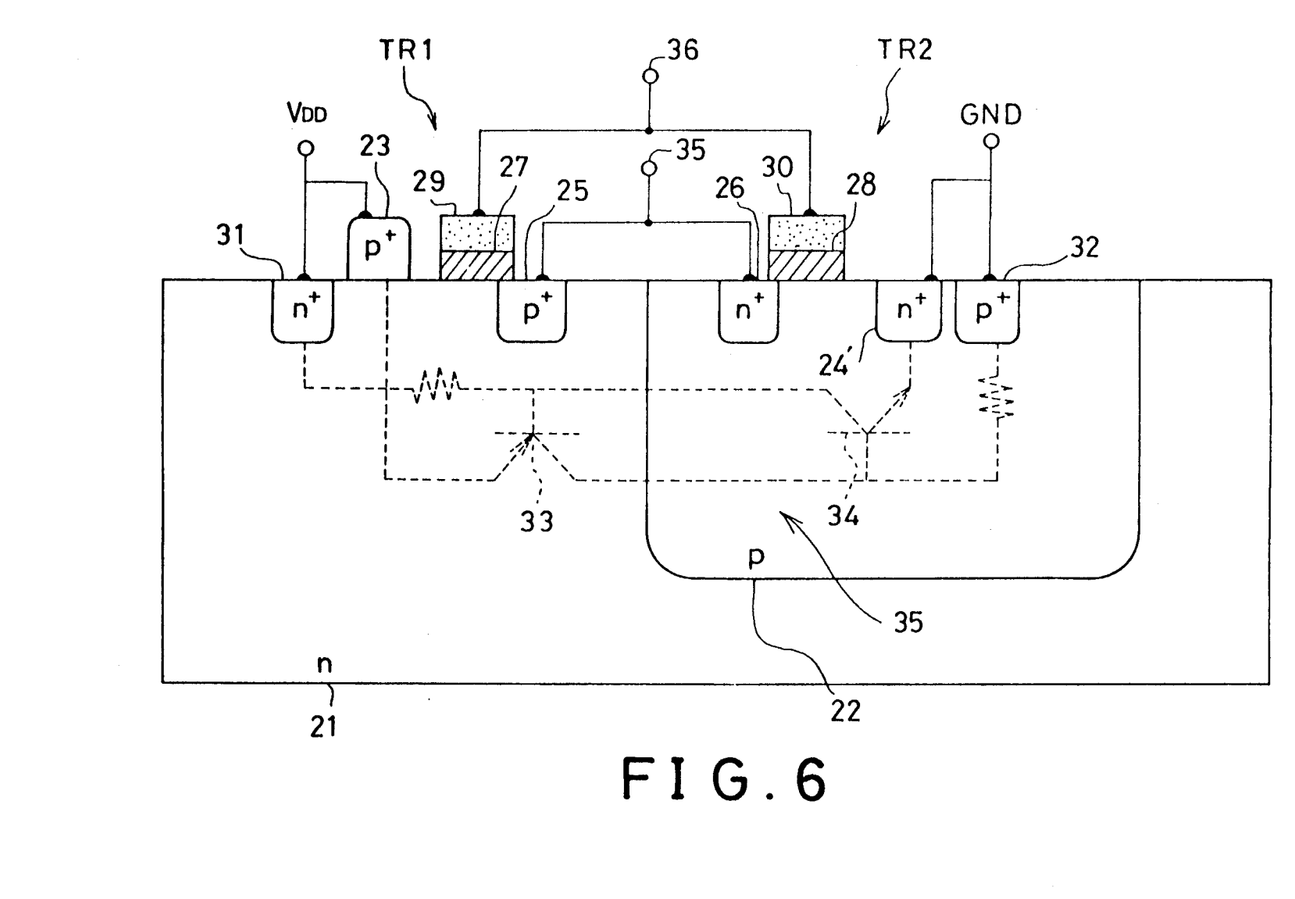
FIG. 6 is a cross sectional view showing another modification of the structure of FIG. 3.

FIG. 6 shows still another modification of the structure of FIG. 3. In the drawing, these parts constructed identically to those corresponding parts in FIG. 3 are given identical reference numerals and the description thereof will be omitted.

Referring to FIG. 6, the source region made of the material having the narrow band gap is used only for the source region 23 of the p-channel MOS transistor and a source region 24' of the n-channel MOS transistor is formed in the well 22 in the substrate 21. In other words, the source region 24' is made from silicon similarly to the well 22 and the substrate 21. Similarly to the modification of FIG. 5, this structure can avoid the latch-up without complicating the procedure for the manufacture of the structure.

It should be noted that the material which can be used for the source region 23 and 24 is not limited to the silicon germanium alloy containing about 15% of germanium but other compositions of silicon germanium alloys may be used similarly as long as they can develop a firm contact with the silicon substrate and have a narrow band gap as compared to silicon.

Further, the material is not limited to the silicon germanium alloy of various compositions but indium arsenide (InAs) having the band gap of 0.36 eV may be successfully deposited on the silicon substrate or well. This material has a significantly narrower band gap as compared to silicon and therefore is quite effective for suppressing the latch-up of the parasitic thyristor.

Further, the conductive types of the respective regions are not limited to the specifically disclosed embodiments.

The method of deposition is not limited to the CVD technique as described but a molecular beam epitaxy may be used as well.

Further, the present invention is not limited to the inverter circuit as illustrated but may be applicable to any circuit devices were the problem of latch-up occurs.

Further, the present invention is not limited to these embodiments but various variations and modifications may be made without departing from the scope of the present invention.

What is claimed is:

1. A complementary metal oxide semiconductor device comprising:
    a substrate having a top surface and comprising a first semiconductor material doped to a first conductivity type;
    a first field effect transistor including a first channel region defined in said substrate, a first source region provided on said substrate adjacent to said first channel region and doped to a second, opposite conductivity type, a first drain region doped to said second conductivity type and provided on said substrate adjacent to said first channel region such that said first channel region is formed between said first source region and said first drain region, and a gate electrode provided on the substrate above said first channel region;
    a well defined in a portion of said substrate, extending to the top surface thereof and excluding the first channel region, the first source region and the first drain region, said well being doped to said second conductivity type;
    a second field effect transistor including a second channel region defined in said well, a second source region provided on said well adjacent to said second channel region and doped to said first conductivity type, a second drain region doped to said first conductivity type and provided on said well adjacent to said second channel region such that said second channel region is formed between said second source region and said second drain region in the well, and a second gate electrode provided on the well above said second channel region; and
    at least one of said first and second source regions being made of a second semiconductor material having a band gap substantially narrower than the band gap of said first semiconductor material, said second semiconductor material being provided on the top surface of the substrate in a state such that a strain is induced in said second semiconductor material.

2. A complementary metal oxide semiconductor device as claimed in claim 1 in which said first semiconductor material comprises silicon and said second semiconductor material comprises an alloy of silicon and germanium.

3. A complementary metal oxide semiconductor device as claimed in claim 2 in which said second semiconductor material contains about 15% of germanium in atomic fraction.

4. A complementary metal oxide semiconductor device as claimed in claim 1 in which said first semiconductor material comprises silicon and said second semiconductor material comprises indium arsenide.

5. A complementary metal oxide semiconductor device as claimed in claim 1 in which said first source region comprises said second semiconductor material.

6. A complementary metal oxide semiconductor device as claimed in claim 1 in which said second source region comprises said second semiconductor material.

7. A complementary metal oxide semiconductor device as claimed in claim 6 in which said well is defined by a top surface flush with the top surface of the substrate, and said second source region is provided on a part of the top surface of the substrate corresponding to the well.

8. A complementary metal oxide semiconductor device as claimed in claim 1 in which both of said first and second source regions comprise said second semiconductor material.

9. A complementary metal oxide semiconductor device as claimed in claim 1 in which said second semiconductor material comprises a semiconductor layer deposited on the top surface of the substrate by a chemical vapor deposition process.

* * * * *

UNITED STATES PATENT AND TRADEMARK OFFICE
CERTIFICATE OF CORRECTION

PATENT NO. : 5,142,641
DATED : August 25, 1992
INVENTOR(S) : Hiroshi FUJIOKA

It is certified that error appears in the above-indentified patent and that said Letters Patent is hereby corrected as shown below:

Col. 1, line 34, change "reversely" to --reverse--;
line 63, after "region," insert --or--.

Col. 4, line 24, change "the hole" to --holes-- and change "the electron" to --electrons--.
line 26, change "paths" to --path--;
line 27, change "region" to --regions--;
line 28, change "path" to --paths--;
line 53, delete "to".

Col. 5, line 4, after "substrate 21" insert --,--;
line 37, change "for source region 23, as described" to --as described for source region 23,--.

Col. 6, line 34, change "assemble" to --assembled--;
line 51, change "hole" to --holes--.

Col. 7, line 18, change "mitter" to --emitter--;
line 37, equation (5) should read as follows:

$$\alpha_E' = I_e / (I_e + I_h \cdot \exp(\Delta E_g / kT))$$

Signed and Sealed this

Eleventh Day of October, 1994

Attest:

BRUCE LEHMAN

*Attesting Officer*     *Commissioner of Patents and Trademarks*